US011825623B2

(12) United States Patent
Lawhon et al.

(10) Patent No.: US 11,825,623 B2
(45) Date of Patent: Nov. 21, 2023

(54) RUGGEDIZED AVIONICS WITH STIFFENING FRAMES FOR USE ON KINETICALLY LAUNCHED VEHICLES

(71) Applicant: SpinLaunch Inc., Long Beach, CA (US)

(72) Inventors: Carl Lawhon, Long Beach, CA (US); Maxim Clarke, Long Beach, CA (US); Jonathan Yaney, Long Beach, CA (US)

(73) Assignee: SpinLaunch Inc., Long Beach, CA (US)

( * ) Notice: Subject to any disclaimer, the term of this patent is extended or adjusted under 35 U.S.C. 154(b) by 0 days.

(21) Appl. No.: 17/875,195

(22) Filed: Jul. 27, 2022

(65) Prior Publication Data
US 2022/0377924 A1    Nov. 24, 2022

Related U.S. Application Data

(62) Division of application No. 16/718,252, filed on Dec. 18, 2019, now Pat. No. 11,483,942.

(51) Int. Cl.
*H05K 7/14*     (2006.01)
*B64G 1/42*     (2006.01)
*B64G 1/52*     (2006.01)

(52) U.S. Cl.
CPC .......... *H05K 7/1402* (2013.01); *B64G 1/425* (2013.01); *B64G 1/52* (2013.01); *H05K 7/1434* (2013.01); *H05K 7/1452* (2013.01)

(58) Field of Classification Search
CPC .. H05K 7/1402; H05K 7/1434; H05K 7/1452; B64G 1/425; B64G 1/002; B64G 1/52; B64G 1/66

(Continued)

(56) References Cited

U.S. PATENT DOCUMENTS 5,471,367 A    11/1995   Krumweide
6,243,273 B1 *   6/2001   Beun .................... H05K 7/1448
                                                              439/630

(Continued)

FOREIGN PATENT DOCUMENTS

WO      WO03048674 A2    12/2003

OTHER PUBLICATIONS

Richard Granitzki, High-G Survivability of an unpotted onboard recorder, Oct. 2017 (Year: 2017).*

(Continued)

*Primary Examiner* — Anatoly Vortman
*Assistant Examiner* — Zhengfu J Feng
(74) *Attorney, Agent, or Firm* — Carr & Ferrell LLP

(57) ABSTRACT

Ruggedized avionics assemblies for use on kinetically launched space vehicles are disclosed. The avionic assemblies are able to maintain structural integrity and functionality under high acceleration forces generated during kinetic launch, including acceleration forces of >5,000 times Earth's gravity in a single direction of loading. The avionics assembly is ruggedized to withstand this level of acceleration force during launch via a plurality of constraining elements to constrain a plurality of printed circuit boards aligned in parallel to an acceleration vector. Further, a high specific strength and stiffness composition of the plurality of constraining elements aids in supporting the printed circuit boards and preventing them from bending and dislodging electronic components mounted to the printed circuit boards.

29 Claims, 10 Drawing Sheets

(58) Field of Classification Search
USPC .......................................................... 361/801
See application file for complete search history.

(56) References Cited

U.S. PATENT DOCUMENTS

| | | | | |
|---|---|---|---|---|
| 6,351,383 | B1* | 2/2002 | Payton | F42B 15/08 |
| | | | | 361/744 |
| 6,498,728 | B1 | 12/2002 | Sarno et al. | |
| 6,879,496 | B1* | 4/2005 | Marshall | H05K 9/0015 |
| | | | | 361/818 |
| 9,273,943 | B1* | 3/2016 | Poulsen | F42B 10/44 |
| 9,589,598 | B1* | 3/2017 | Gilley | G11C 5/005 |
| 10,059,472 | B2* | 8/2018 | Yaney | F41B 3/04 |
| 11,483,942 | B2 | 10/2022 | Lawhon et al. | |
| 2002/0012237 | A1 | 1/2002 | Dimarco | |
| 2006/0282724 | A1 | 12/2006 | Roulo | |
| 2010/0008053 | A1 | 1/2010 | Osternack et al. | |
| 2010/0188831 | A1* | 7/2010 | Ortet | H05K 7/1412 |
| | | | | 361/788 |
| 2010/0296258 | A1* | 11/2010 | Geswender | H05K 1/144 |
| | | | | 361/803 |
| 2010/0319948 | A1 | 12/2010 | Vander Ploeg et al. | |
| 2010/0321891 | A1 | 12/2010 | Steenwyk et al. | |
| 2015/0367964 | A1* | 12/2015 | Judd | B64G 1/42 |
| | | | | 244/158.1 |
| 2016/0205814 | A1* | 7/2016 | Burke | H05K 9/006 |
| | | | | 174/377 |
| 2018/0079149 | A1* | 3/2018 | Suresh | B29C 64/386 |
| 2018/0110149 | A1* | 4/2018 | Guillot | H05K 1/111 |
| 2018/0124953 | A1* | 5/2018 | Engelhardt | H05K 7/20409 |
| 2021/0195780 | A1 | 6/2021 | Lawhon et al. | |

OTHER PUBLICATIONS

3U CubeSat Structure; CSS, [online], [retrieved on Mar. 4, 2020], Retrieved from the Internet: <URL:https://www.c3s.hu/portfolio-item/3u-cubesat-structure/>, 5 pages.

Burd, Jeff, "High-G Ruggedization Methods for Gun Projectile Electronics", Proceedings of the 12th International Technical Meeting of the Satellite Division of The Institute of Navigation (ON GPS 1999); Sep. 14-17, 1999, Nashville, TN, pp. 1133-1141.

Granitzki et al., "High-G Survivability of an Upotted Onboard Recorder", Technical Report; ARDEC, METC, RDAR-MEF-I Picatinny Arsenal United States; Oct. 1, 2017, [online], [retrieved on Mar. 4, 2020], Retrieved from the Internet: <URL:https://apps.dtic.mil/dtic/tr/fulltext/u2/1041155.pdf>, 23 pages.

Flyash et al., "High-G Telemetry System for Tank Munitions", 23rd International Symposium on Ballistics; Tarragona, Spain, Apr. 16-20, 2007, 8 pages.

Burd, Jeff, "High-G Ruggedization Methods for Gun Projectile Electronics", L3 Communications Interstate Electronics Corp., Sep. 1999, 9 pages.

Granitzki et al., "High-G Survivability of an Unpotted Onboard Recorder", U.S. Army Armament Research, Development and Engineering Center, Munitions Engineering Technology Center, Oct. 2017, 23 pages.

* cited by examiner

RUGGEDIZED AVIONICS WITH STIFFENING FRAMES FOR USE ON KINETICALLY LAUNCHED VEHICLES

CROSS REFERENCE TO RELATED APPLICATION

This application is a Divisional Application of U.S. patent application Ser. No. 16/718,252, filed on Dec. 18, 2019, which is hereby incorporated by reference in its entirety, including all references and appendices cited therein.

FIELD OF THE INVENTION

The present disclosure relates generally to the field of kinetically launched vehicles and satellites, and more specifically to structural assemblies and methods for ruggedizing avionics on kinetically launched vehicles such that the avionics maintain structural integrity during the high acceleration forces generated during a kinetic launch.

SUMMARY

This summary is provided to introduce a selection of concepts in a simplified form that are further described in the Detailed Description below. This summary is not intended to identify key features or essential features of the claimed subject matter, nor is it intended to be used as an aid in determining the scope of the claimed subject matter.

Various embodiments of the present disclosure may be directed to methods and apparatuses for providing ruggedized avionics for use with vehicles and satellites configured for a kinetic space launch. The avionics maintain structural integrity and functionality of the electronic components on printed circuit boards (PCBs) under high acceleration forces generated during kinetic launch, including acceleration forces of >5,000 times Earth's gravity in a single direction of loading. The avionics assembly is ruggedized to withstand this level of acceleration force during launch via a plurality of constraining elements (e.g., slots) to constrain a plurality of printed circuit boards aligned approximately in parallel to an acceleration vector. Further, a high specific strength and/or stiffness composition of the plurality of constraining elements aids in supporting the printed circuit boards and preventing them from bending and dislodging electronic components mounted to the printed circuit boards. Additionally, board-to-board connections allow communication of power and signals between the printed circuit boards, eliminating the need to ruggedize wires. The present disclosure allows for the launch of spacecrafts, vehicles, or satellites via a kinetic launcher, which generates loading forces in the opposite direction of acceleration.

Other examples and embodiments are discussed in further detail below.

BRIEF DESCRIPTION OF THE DRAWINGS

Certain embodiments of the present disclosure are illustrated by the accompanying figures. It will be understood that the figures are not necessarily to scale and that details not necessary for an understanding, or that render other details difficult to perceive, may be omitted. Embodiments are illustrated by way of example and not by limitation in the figures of the accompanying drawings, in which like references indicate similar elements.

DETAILED DESCRIPTION

Figure 1A:
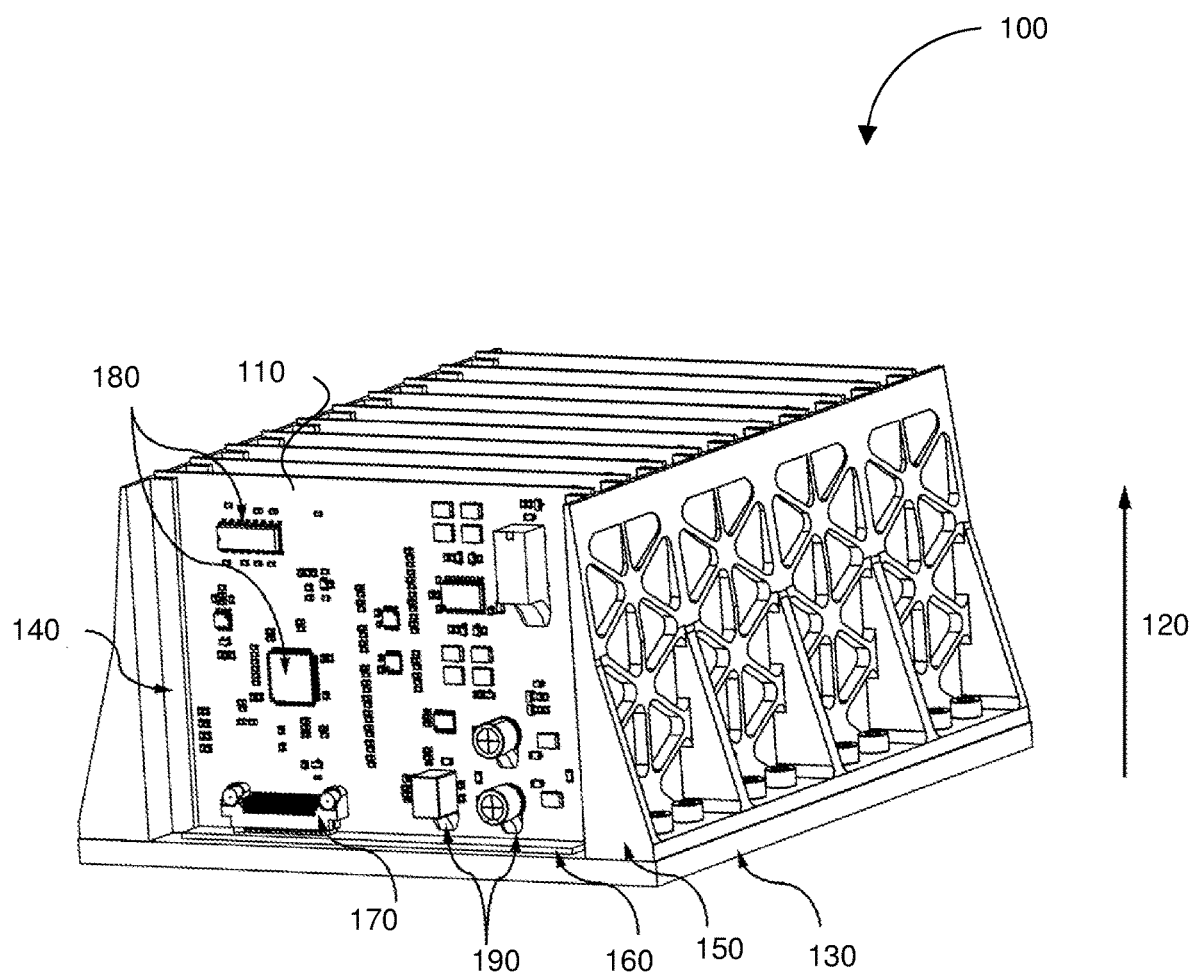
FIG. 1A depicts a front view of an exemplary embodiment of a ruggedized avionics assembly for use on kinetically launched vehicles.

The following detailed description includes references to the accompanying drawings, which form a part of the detailed description. The drawings show illustrations in accordance with example embodiments. These example embodiments, which are also referred to herein as "examples," are described in enough detail to enable those skilled in the art to practice the present subject matter. The embodiments can be combined, other embodiments can be utilized, or structural, logical, and other changes can be made without departure from the scope of what is claimed. The following detailed description is therefore not to be taken in a limiting sense, and the scope is defined by the appended claims and their equivalents.

The corresponding structures, materials, acts, and equivalents of all means or step plus function elements in the claims below are intended to include any structure, material, or act for performing the function in combination with other claimed elements as specifically claimed. The description of the present technology has been presented for purposes of illustration and description, but is not intended to be exhaustive or limited to the present technology in the form disclosed. Many modifications and variations will be apparent to those of ordinary skill in the art without departing from the scope and spirit of the present technology. Exemplary embodiments are chosen and described in order to best explain the principles of the present technology and its practical application, and to enable others of ordinary skill in the art to understand the present technology for various embodiments with various modifications as are suited to the particular use contemplated.

Aspects of the present disclosure are described herein with reference to flowchart illustrations and/or block diagrams of methods, and apparatus (systems) according to embodiments of the present technology. The flowchart illustrations and/or block diagrams in the Figures illustrate the architecture, environment, functionality, and operation of possible implementations of systems, methods and apparatuses according to various embodiments of the present disclosure. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

In the following description, for purposes of explanation and not limitation, specific details are set forth, such as particular embodiments, procedures, techniques, etc. in order to provide a thorough understanding of the present invention. However, it will be apparent to one skilled in the art that the present invention may be practiced in other embodiments that depart from these specific details.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" or "according to one embodiment" (or other phrases having similar import) at various places throughout this specification are not necessarily all referring to the same embodiment. Furthermore, the particular features, structures, or characteristics may be combined in any suitable manner in one or more embodiments. Furthermore, depending on the context of discussion herein, a singular term may include its plural forms and a plural term may include its singular form. Similarly, a hyphenated term (e.g., "on-demand") may be occasionally interchangeably used with its non-hyphenated version (e.g., "on demand"), a capitalized entry (e.g., "Panel") may be interchangeably used with its non-capitalized version (e.g., "panel"). Such occasional interchangeable uses shall not be considered inconsistent with each other.

Also, some embodiments may be described in terms of "means for" performing a task or set of tasks. It will be understood that a "means for" may be expressed herein in terms of a structure, device, composition, or combinations thereof.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Satellites are used for many purposes and are traditionally launched into Earth orbit or beyond via a rocket-propelled launch vehicle. Traditional rockets carry massive quantities of propellant to deliver payloads that are minute fractions of the overall vehicle sizes and weights. All of the performance and risks are built into a precision, often single-use vehicle that must be highly reliable and inherently costly.

While incremental gains have been made in rocket technologies to reduce space launch costs, alternative approaches are necessary to reduce those costs and increase launch rates by the orders of magnitude necessary to create exponential growth in the space transportation industry. Since the beginning of the space program, ground-based non-rocket launch systems such as rail guns and ram accelerators have been proposed to achieve this. Additionally, centripetal launchers, such as one described in related U.S. Pat. No. 10,059,472 issued on Aug. 28, 2018 and entitled "Circular Mass Accelerator" may be used instead of a rocket-propelled space launch.

Use of kinetic energy to provide the energy needed to launch a payload into space (instead of rocket propulsion), requires high acceleration forces to be generated at launch to ensure the payload has sufficient velocity to actually reach Earth orbit or beyond. Kinetically launched satellites and spacecrafts are satellites and spacecrafts launched into Earth orbit with the assistance of a ground-based mass acceleration technology, such as a centripetal launcher. Kinetic launchers subject the satellites to static or quasi-static acceleration loading in excess of 5,000 times Earth's gravity (G-force). As such, kinetically launched satellites and spacecrafts must be designed to withstand this extreme high acceleration loading force generated at launch from Earth. As used herein, static or quasi-static acceleration is acceleration that is relatively constant for an extended period of time and acts primarily in a single direction through the satellite or spacecraft structure. As such, this does not include vibrational loading. Further, as used herein, the "top" of a satellite or spacecraft faces the direction of acceleration and opposes the loading direction. The "bottom" of a satellite or spacecraft opposes the "top" of the satellite or spacecraft and the "sides" of the satellite or spacecraft are parallel to the acceleration vector.

There are many different ways to accelerate a satellite or spacecraft via a kinetic launcher. That is, the satellite or spacecraft can be held from a top surface, bottom surface, or one or more side surfaces. Each scenario generates different acceleration forces. Embodiments of the present disclosure describe satellites or spacecrafts that experience compression loading during kinetic launch, i.e. loading forces that compress the satellite or spacecraft, as opposed to loading forces that pull the satellite or spacecraft apart or shear the satellite or spacecraft from the sides.

Satellites or spacecrafts that are launched into Earth orbit without a kinetic launcher, such as satellites or spacecrafts launched via rocket propelled systems, primarily need to withstand vibrational loading during launch. Satellites or spacecrafts undergoing orbital insertion via rocket launch will undergo a maximum of 10 times Earth gravity of quasi-static loading. As such, the loading force that the satellite needs to be designed to withstand is much less than the loading force subjected upon a satellite or spacecraft launched into Earth orbit via a kinetic launcher.

Embodiments of the present disclosure describe structural design changes and ruggedization systems and methods that are necessary for kinetically launched avionics. Firstly, due to the extreme high loading force generated during launch of a kinetically launched satellite or spacecraft, avionics on the satellite or spacecraft need to be specifically designed to withstand the high forces while maintaining structural integrity. Additionally, avionics on the satellite or spacecraft need to be mass-optimized. Any orbital launch system is limited by the total amount of mass it can get into space or orbit, which also affects a launch's profitability. Furthermore, the heavier an avionics assembly is, the heavier the structure that needs to support the avionics assembly needs to be. Therefore, by creating a lighter avionics assembly with embodiments of the present disclosure, entire satellites and launch vehicles can also be made lighter.

Generally, during a launch process from a kinetic launcher, such as a centripetal launcher or a gun, avionics within a satellite or spacecraft can experience solder joint failure, printed circuit board flexure, and/or electronic components and/or wire failure under acceleration load. Flexure of a printed circuit board under acceleration load causes planar deformation in the surface that electronic components are mounted to, which can pose sufficient strain to break solder joints or disbond a solder pad from the printed circuit board substrate. Wires are generally susceptible to failure under the acceleration load levels seen in kinetic space launch, and current techniques for ruggedizing wires are not mass-efficient. Often times, potting, which may involve encapsulating electronic assemblies in epoxy adhesive, is a technique used to ruggedize avionics; however, potting increases the mass of the avionics.

Embodiments of the present disclosure provide that launch vehicle and satellite avionics can maintain structural integrity and functionality in the high g-loading conditions of a kinetic launch through a mass-optimized structural design. Thus, structural design techniques and mechanisms are disclosed herein to eliminate failure of solder joints between electronic components and the printed circuit boards they are mounted to, eliminate the use of wires where possible by substituting their use with the use of board-to-board connectors to increase mass efficiency, and to fixture and build printed circuit boards in a way that is rugged to ensure electronics survive the acceleration loads of kinetic launch. As would be understood by persons of ordinary skill in the art, while the present disclosure describes satellite and spacecraft launch, the ruggedized fixturing methods avionics described herein may also be utilized with other types of payloads that are not specifically satellites or spacecrafts.

Typically, the primary failure mode of avionics under high g-loads is not at the level of individual electronic components such as integrated circuits that are mounted to printed circuit boards or passive components, but rather bending of printed circuit boards that causes electronic components to disassemble from the printed circuit boards. The strain caused by the bending can cause solder joints to fail which damages the connections of the electronic components to the printed circuit board and damages the circuit. The bending of printed circuit boards can be mitigated by aligning printed circuit boards with respect to the acceleration vector in a way that does not promote bending and to support printed circuit boards to prevent buckling failure (i.e., bending in the direction perpendicular to loading).

FIG. 1A depicts a front view of an exemplary embodiment of an avionics assembly 100 that has been ruggedized to withstand kinetic launch acceleration loading aligned parallel to the plane of a plurality of printed circuit boards 110 (PCBs). In exemplary FIG. 1A, PCBs 110 are aligned "vertically" with respect to the acceleration loading vector 120 and in parallel to each other. The weight of PCBs 110 and the electronic components mounted to PCBs 110 are transferred to a horizontal support surface 130 via compression loading along the plane of PCBs 110 and through the bottom edges of PCBs 110. In some embodiments, horizontal support surface 130 can be a flat surface provided by a primary structure of the satellite or launch vehicle, a "floor" of an enclosure, or a flat surface further attached to the primary structure of the satellite or launch vehicle. As used herein, a primary structure of a launch vehicle may be all higher order mechanical structure(s) of a spacecraft or satellite such as the "body," "chassis," or "frame." The primary structure may also include any structure that attaches to the "body," "chassis," or "frame."

As a result, PCBs 110 do not sustain bending moment and do not flex under the acceleration loading of kinetic launch.

In some embodiments, PCBs 110 are constrained on their vertical edges by slots 140 (also sometimes referred to herein as "constraining elements") in vertical side walls 150 in order to constrain PCBs 110 from buckling under the compression load. Buckling would result in flexure of PCBs 110 and subsequent solder joint failure. PCBs 110 can be custom-made in order to fit inside slots 140 such that electronic components are not placed all the way to the edges of the PCBs 110 which would prevent PCBs 110 from fitting into slots 140. In some embodiments, vertical side walls 150 are mass optimal structures optimized to prevent buckling. For example, vertical side walls 150 may be of a triangularized structure (e.g., an isogrid structure) or have any other mass-optimized geometry to withstand the acceleration loading and provide stiffening.

To further mass-optimize avionics assembly 100, vertical side walls 150 may be made of one or more high specific strength and/or stiffness materials that are designed to resist buckling. Exemplary suitable high specific strength and/or stiffness materials include one or more of aluminum, titanium, magnesium, beryllium, silicon carbide, and carbon fiber composite. As would be understood by persons of ordinary skill in the art, other suitable materials may also be used in addition to, or instead of, the specific components listed here. In some embodiments, vertical side walls 150 may be mounted to horizontal support surface 130. For example, vertical side walls 150 may be mounted to horizontal support surface with screws, steel screws, glue, or any other mounting mechanisms.

Communication of power and signals between PCBs 110 in avionics assembly 100 can be achieved through a "backplane" printed circuit board 160 that the vertical PCBs 110 connect to via a board-to-board connector 170 at their base. In some embodiments, backplane PCB 160 is perpendicular to acceleration loading vector 120. Backplane PCB 160 may comprise copper traces to provide a communications and power interface between the PCBs 110. Backplane PCB 160 may further be protected from flexure and failure by virtue of backplane PCB 160 resting on horizontal support surface 130. In other embodiments, communication of power and signals between PCBs 110 in avionics assembly 100 can be achieved through a flexible printed circuit board joint.

Generally, most surface mount electronic components are able to withstand the shear load of their own weight under the acceleration loads of kinetic launch without solder joint failure when mounted to the side of a vertically aligned PCB such as PCB 110. However, certain components may require additional structural reinforcement. For example, some components that may require additional structural reinforcement are electronic components that extend far off the surface of the PCB, presenting a substantial cantilever moment to the solder joints, components that have a small solder bond surface area relative to the component's mass, and components that are made of fragile material such as ferrite. In some embodiments, these components can be structurally reinforced using epoxy adhesive.

Referring back to FIG. 1, use of either underfill 180 techniques or staking 190 techniques are generally effective in ensuring that these components survive the acceleration loads of kinetic launch without failing. Through underfill 180 techniques, epoxy adhesive may be applied between the underside of an electronic component and the surface of the PCB. Through staking 190 techniques, a fillet of epoxy can be applied between a side of an electronic component and the PCB that the electronic component is mounted to. In some embodiments, staking 190 can be done on the side of the electronic components that is facing downwards towards horizontal support surface 130. In some embodiments, avionics assembly 100 can be enclosed, for example, to protect the avionics assembly 100 from radiation or control avionics assembly 100 thermally.

Figure 1B:
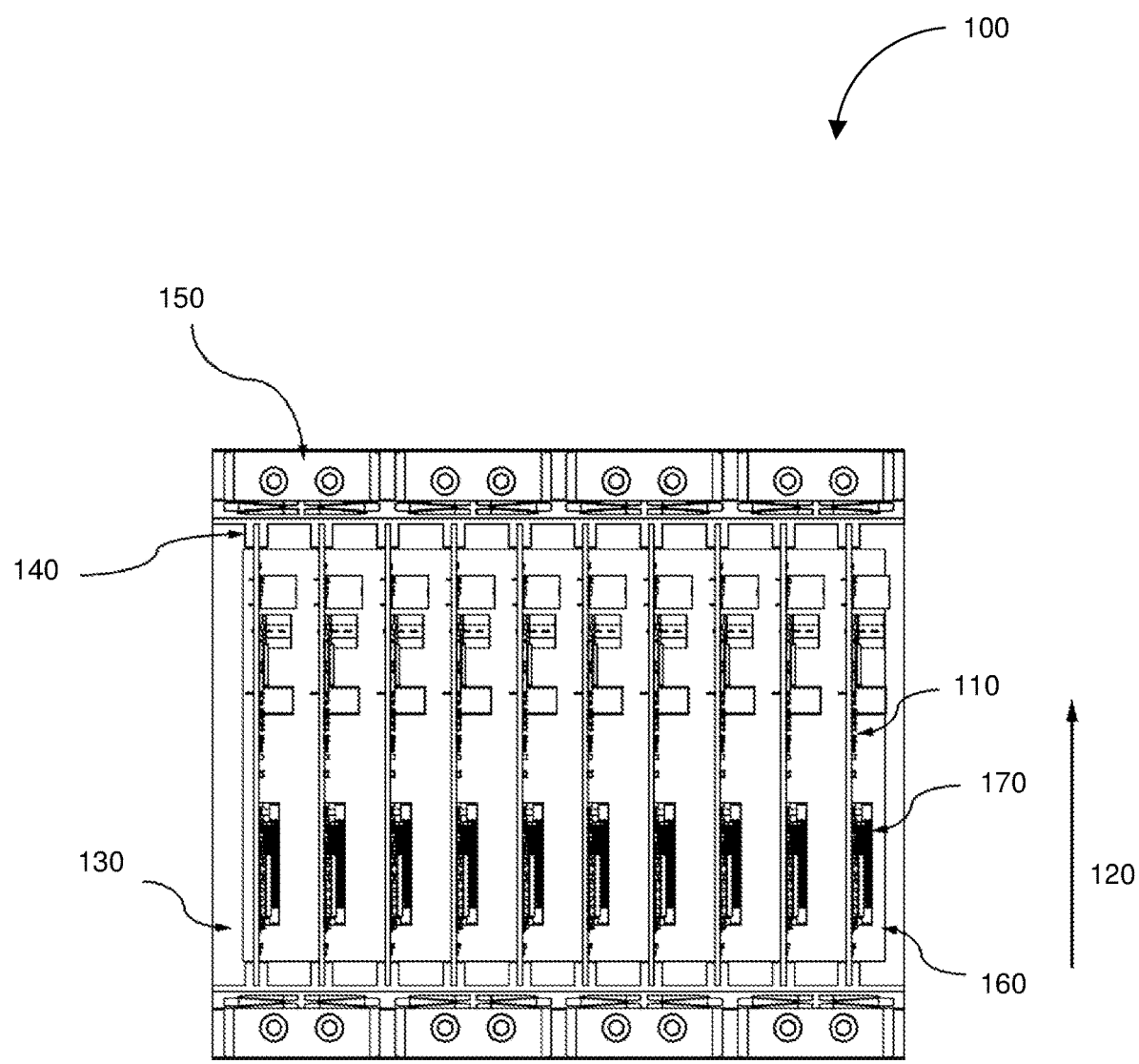
FIG. 1B depicts a top view of an exemplary embodiment of ruggedized avionics assembly for use on kinetically launched vehicles.
Figure 1C:
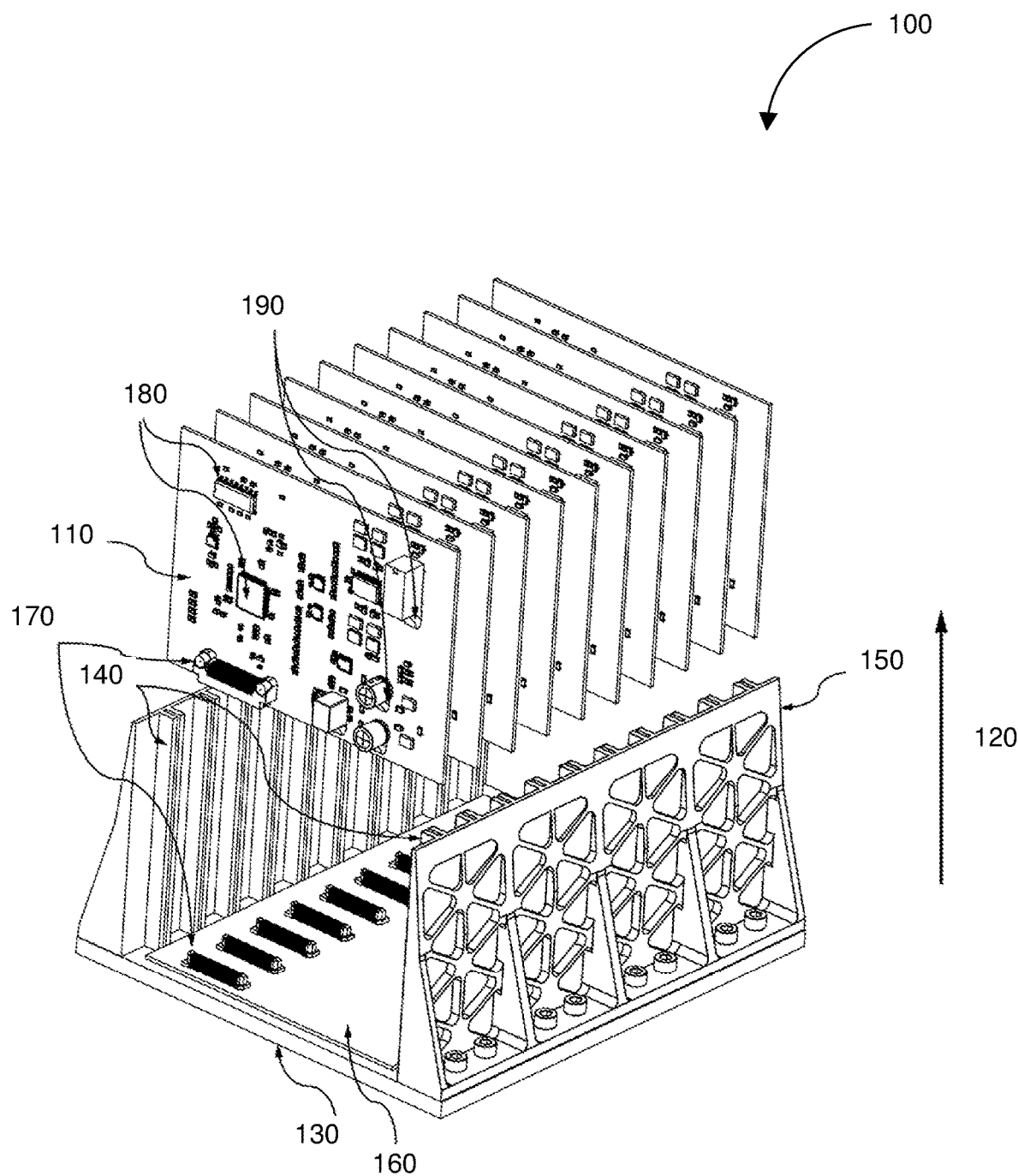
FIG. 1C depicts an exploded view of an exemplary embodiment of ruggedized assembly avionics for use on kinetically launched vehicles.

FIG. 1B depicts a top view of the exemplary embodiment of avionics assembly 100. FIG. 1C depicts an exploded view of the exemplary embodiment of avionics assembly 100.

Figure 3A:
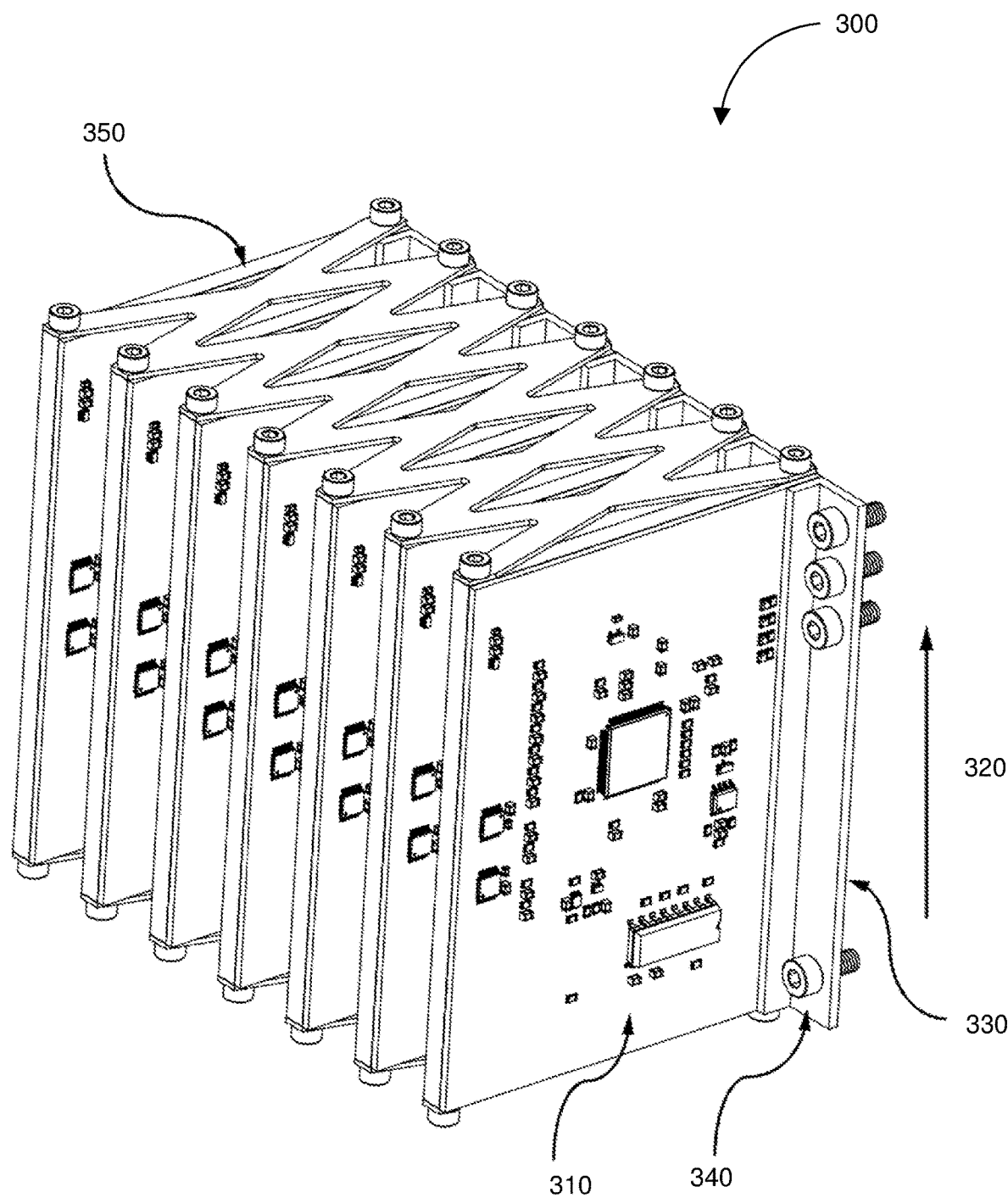
FIG. 3A depicts a front view of another exemplary embodiment of ruggedized avionics assembly for use on kinetically launched vehicles.

FIG. 3A depicts a front view of another embodiment of an avionics assembly 300 wherein the plurality of PCBs 310 are still aligned vertically with respect to the acceleration vector 320 and mounted to a vertical surface 330 of the satellite or spacecraft's primary structure. In FIG. 3A, one of the vertical edges of PCBs 310 is attached directly to a vertical surface 330 of a satellite or spacecraft's primary structure using one or more bonded brackets 340. In some embodiments, PCBs 310 and bonded brackets 340 are mounted to vertical surface 330 of the primary structure using screws, steel screws, glue, or any other mounting mechanisms.

Figure 3B:
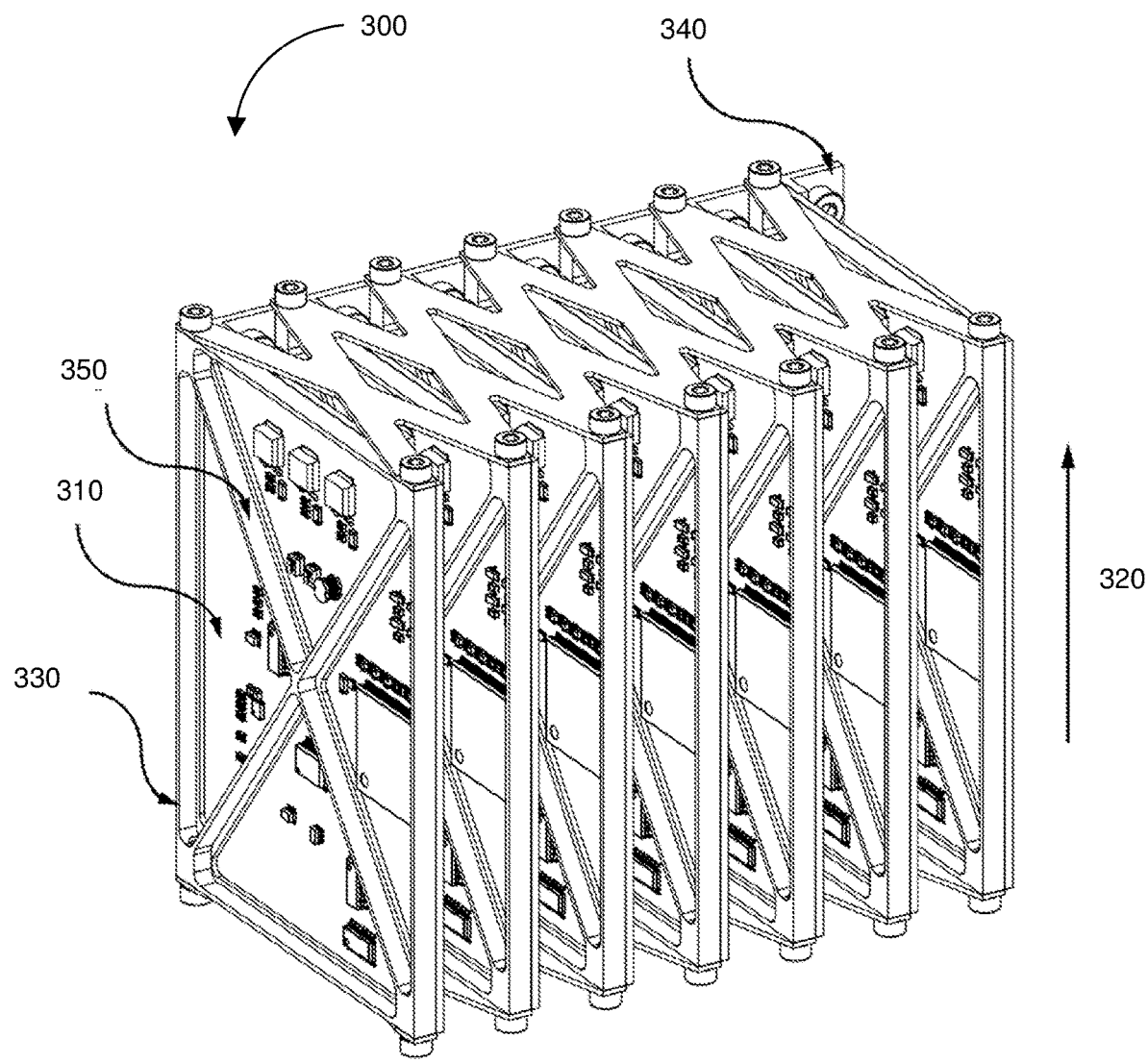
FIG. 3B depicts a back view of another exemplary embodiment of ruggedized avionics assembly for use on kinetically launched vehicles.
Figure 3C:
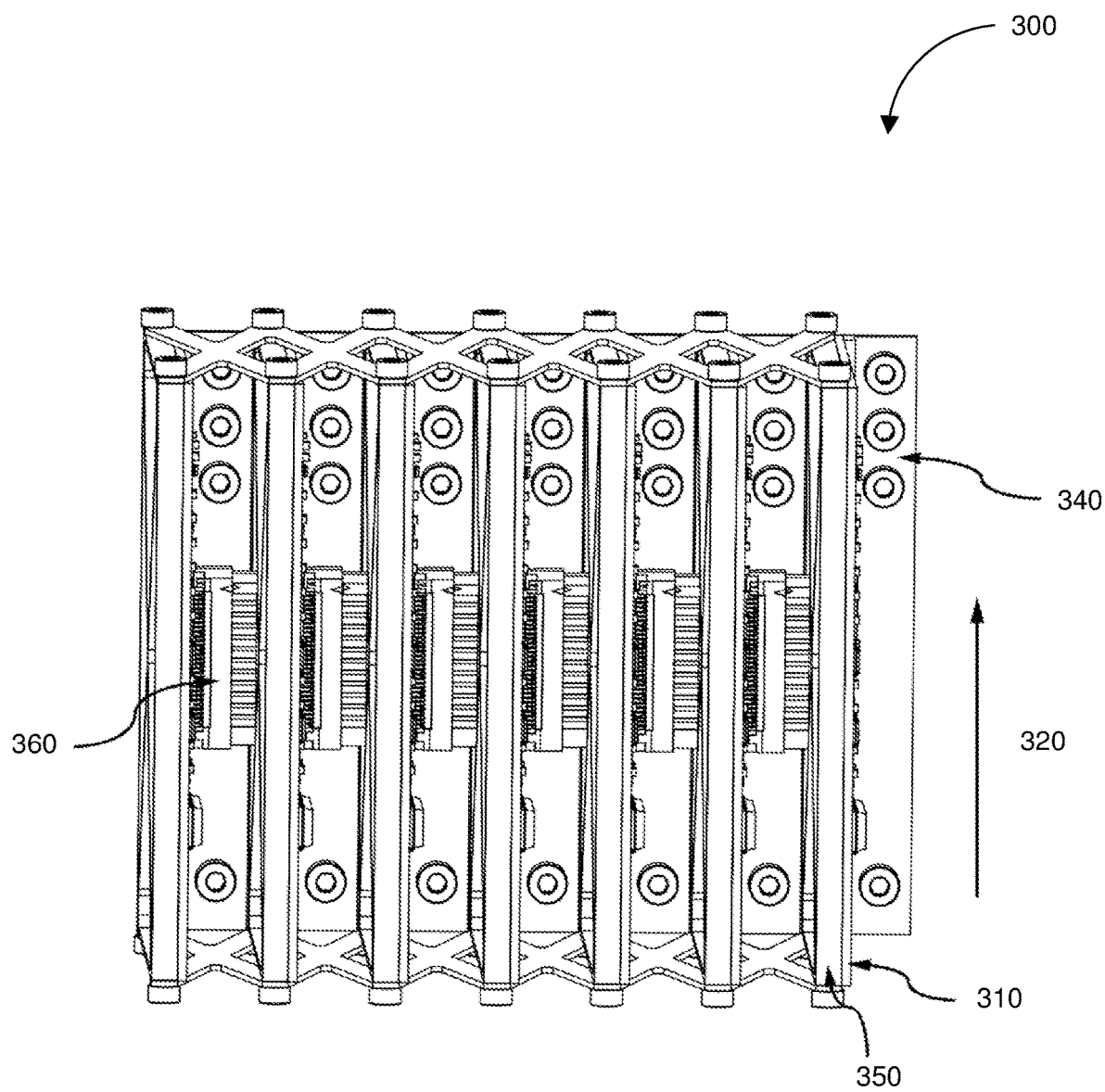
FIG. 3C depicts a top view of another exemplary embodiment of ruggedized avionics assembly for use on kinetically launched vehicles.

In FIG. 3A, PCBs 310 effectively act as cantilever beams. Generally, there is a limited set of geometries of PCBs 310 that can accept this sort of loading, and it also depends on the magnitude of the acceleration load. PCBs 310 that are mounted from the vertical edge are at a higher risk of buckling under the acceleration load than direct material failure, and buckling must be avoided to ensure that electronic components do not disassemble from PCBs 310 as they bend. Thus, stiffening elements can be attached to PCBs 310 to reinforce PCBs 310 and to prevent buckling. In FIG. 3B, which depicts a back view of avionics assembly 300, and in FIG. 3C, which depicts a top view of avionics assembly 300, a stiffening frame 350 is mounted to one side of PCBs 310 to increase PCBs buckling strength several fold. In some embodiments, stiffening frame 350 can comprise one or more triangular support structures (e.g., an isogrid). As would be understood by persons of ordinary skill in the art, other suitable geometries may be used for stiffening frame 350. Stiffening frame 350 may be made of one or more high specific strength and/or stiffness materials that are designed to resist buckling. Exemplary suitable high specific strength and/or stiffness materials include one or more of aluminum, titanium, magnesium, beryllium, silicon carbide, and carbon fiber composite. As would be understood by persons of ordinary skill in the art, other suitable materials may also be used in addition to, or instead of, the specific components listed here.

Communication of power and signals between PCBs 310 can be achieved with the use of board-to-board connectors 360 that connect PCBs 310 directly to each other, or via a flexible printed circuit board joint. Further, while not explicitly depicted in FIG. 3A, surface mount electronic components mounted to PCBs 310 may be structurally reinforced, for example, using underfill or staking techniques using epoxy adhesive. In some embodiments, staking can be done on the side of the electronic components that is facing downwards. In some embodiments, avionics assembly 300 can be enclosed, for example, to protect the avionics assembly 300 from radiation or control avionics assembly 300 thermally.

Figure 4A:
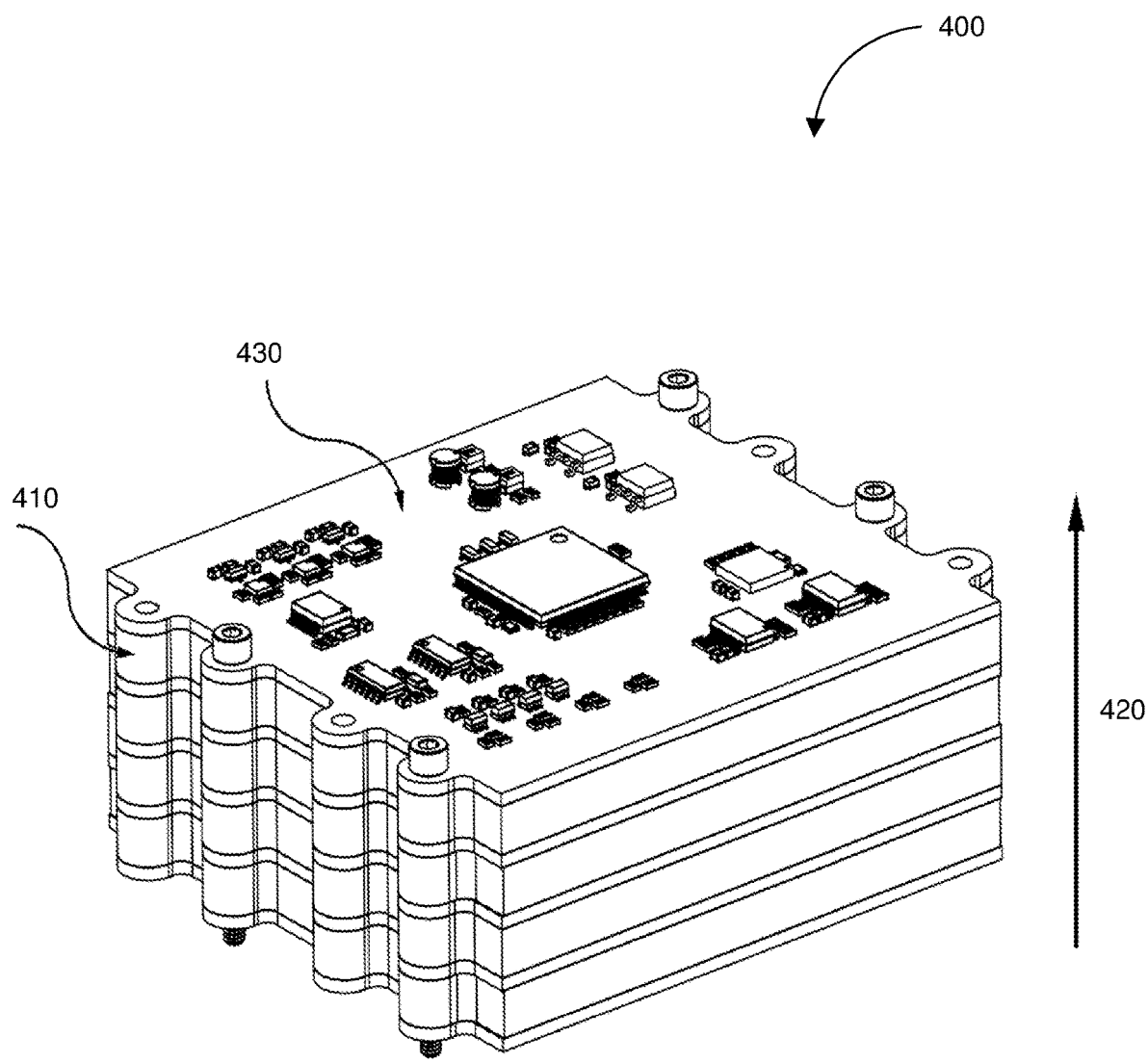
FIG. 4A depicts a front view of another exemplary embodiment of ruggedized avionics assembly for use on kinetically launched vehicles.

FIG. 4A depicts a front view of another embodiment of an avionics assembly 400 that has been ruggedized to withstand kinetic launch acceleration loading with a plurality of PCBs 410 aligned horizontally with respect to the acceleration vector 420. In exemplary FIG. 4A, PCBs 410 are stacked on top of each other and each of PCB 410 are supported by a plurality of spacers 430 to withstand bending of PCBs 410. In some embodiments, spacers 430 may be webbed spacers or spacers of any suitable geometry to support PCBs 410 and limit the downward flex of PCBs 410. The weight of PCBs 410 and the electronic components mounted to PCBs 410 are transferred to the satellite or spacecraft's primary structure (not depicted) upon which avionics assembly 400 is mounted on first through transverse shear in PCB 410 to spacer 430 supporting PCB 410, then through compression in spacer 430 to another PCB 410 below, and then to another spacer 430 supporting the PCB 410 until the bottommost PCB 410 that rests on a flat surface provided by the primary structure is reached. In some embodiments, the bottommost PCB 410 may rest on a horizontal support surface (not depicted) that then rests on the primary structure. In some embodiments, spacers 430 are all the same shape such that the weight of spacers 430 gets transferred through PCBs 410 into the next spacer 430.

Figure 4B:
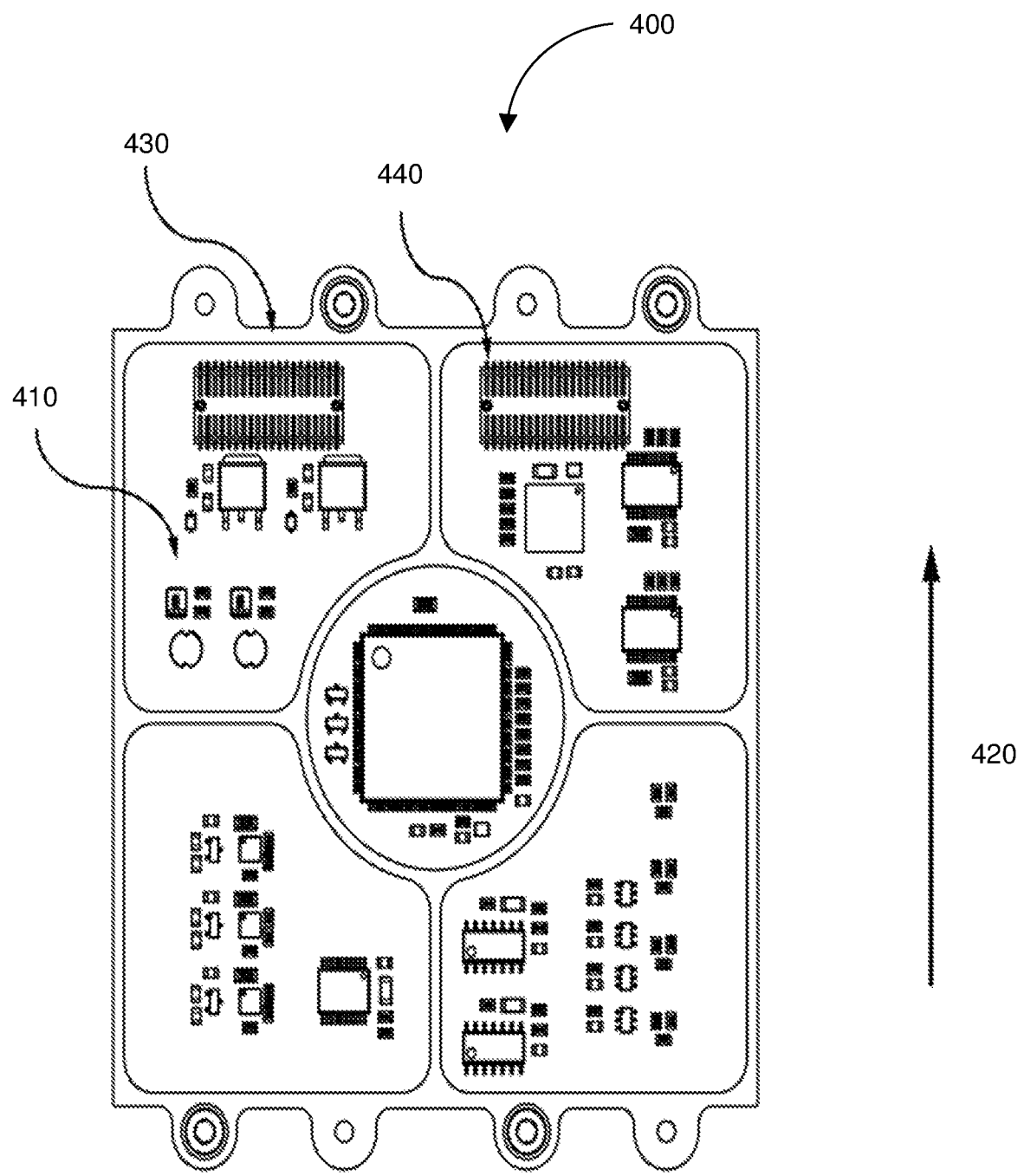
FIG. 4B depicts a top view of another exemplary embodiment of ruggedized avionics assembly for use on kinetically launched vehicles.
Figure 4C:
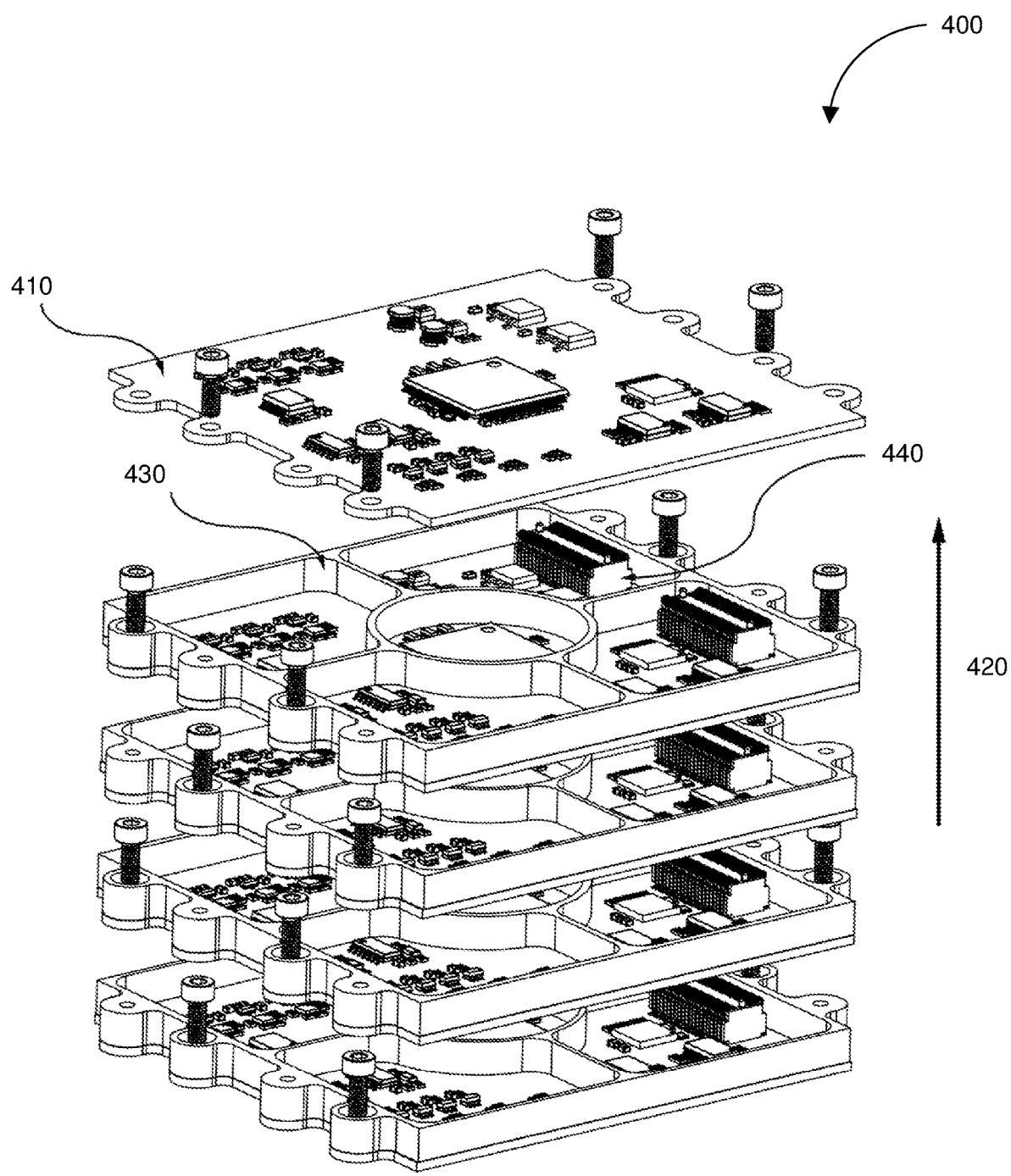
FIG. 4C depicts an exploded view of another exemplary embodiment of ruggedized avionics assembly for use on kinetically launched vehicles.

PCBs 410 may be designed such that electronic components are placed away from areas that make contact with spacer 430, allowing spacer 430 to directly contact the PCB 410 substrate and transfer load to from PCB 410 directly. Not only does spacer 430 act as a standoff, but spacer 430 also limits the degree that PCB 410 flexes downwards. PCB flexing is the primary cause of solder joint breakage in surface mount electronic components because bending causes deformation in the surface that the electronic components are mounted to (i.e., bending strain) which results in strain on solder joints that can exceed their structural limit. In exemplary FIGS. 4A-4C, PCB 410 will flex in the areas that are not supported, but the webbing in spacers 430 can limit the size of the PCB 410 surface that can flex downwards, thus limiting maximum bending strain. The webbing in spacers 430 can limit the "moment arm" of the weight of PCB 410 by supporting PCB 410 at multiple points across PCB 410's span, thus limiting maximum bending strain.

Spacer 430 may be made of one or more high specific strength and/or stiffness materials that are designed to resist bending. Exemplary suitable high specific strength and/or stiffness materials include one or more of aluminum, titanium, magnesium, beryllium, silicon carbide, and carbon fiber composite. As would be understood by persons of ordinary skill in the art, other suitable materials may also be used in addition to, or instead of, the specific components listed here. Spacer 430 should also be as lightweight as possible so as not to add too much weight to avionics assembly 400 and designed in such a way that there will be enough space on PCB 410 for all electronic components.

Generally, components mounted to the top of PCB 410 will not require structural reinforcement as they will experience compression into the surface of PCB 410. Further, PCB 410 substrate may comprise at least one material with a higher specific stiffness than traditional FR-4 composite. FR-4 is a glass fiber epoxy laminate that comprises the substrate of nearly all printed circuit boards. It is formulated to be flame resistant. However, components mounted to the bottom of PCB 410 may require structural reinforcement, for example, using underfill or staking techniques using epoxy adhesive. Further, communication of power and signals between PCBs 410 can be achieved with the use of board-to-board stack connectors 440 that connect PCBs 410 directly to each other, eliminating the need for wiring between PCBs 410 in avionics assembly 400, or via a flexible printed circuit board joint. In some embodiments, avionics assembly 400 may be mounted to horizontal support surface or horizontal surface of the satellite or spacecraft's primary structure. For example, avionics assembly 400 may be mounted with screws, steel screws, glue, or any other mounting mechanisms.

PCBs of any of the exemplary embodiments discussed herein may be constructed from strengthened materials to make them lighter, improve thermal properties, and reduce the amount of support structure required for the PCBs. Exemplary strengthened materials include one or more of high performance fiberglass, metal, and carbon fiber composite. Further, topology optimization methodologies may be utilized to design any of the support structures discussed herein, such as support walls, stiffening frames, and spacers. In exemplary embodiments, 3D printing may be utilized to make one or more of the topology optimized structures.

Figure 2:
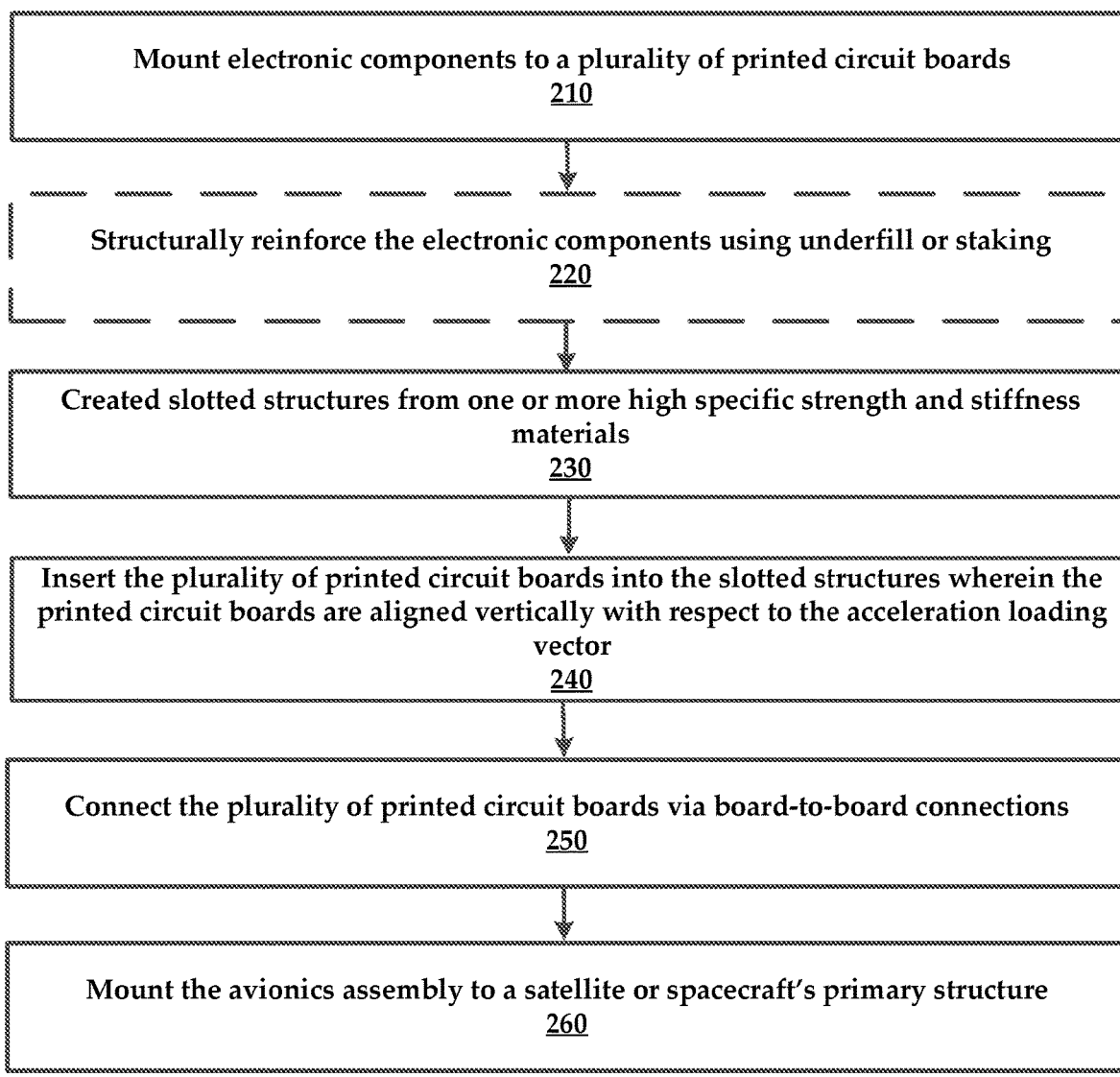
FIG. 2 depicts an exemplary method for providing ruggedized avionics assemblies for use of kinetically launched vehicles.

FIG. 2 depicts an exemplary method 200 for providing ruggedized avionics assemblies for use on kinetically launched satellites and spacecrafts. With this method, the avionics assemblies can withstand static and quasi-static acceleration forces of at least 5,000 times Earth's gravity, in the same direction of loading, during a kinetic launch and maintain structural integrity and functionality of the avionics assemblies. In some embodiments, the operations may be combined, performed in parallel, or performed in a different order. The method 200 may also include additional or fewer operations than those illustrated.

In step 210, electronic components are mounted to a plurality of printed circuit boards. In optional step 220, the electronic components may be structurally reinforced using underfill or staking techniques. In step 230, slotted structures are made from one or more high specific strength and/or stiffness materials. Exemplary suitable high specific strength and/or stiffness materials include one or more of aluminum, titanium, magnesium, beryllium, silicon carbide, and carbon fiber composite. As would be understood by persons of ordinary skill in the art, other suitable materials may also be used in addition to, or instead of, the specific components listed here.

In step 240, the plurality of printed circuit boards are inserted into the slotted structures composed of high specific strength and/or stiffness materials wherein the printed circuit boards are aligned vertically with respect to the acceleration loading vector. In step 250, the plurality of printed circuit boards are connected via board-to-board connectors, or via a flexible printed circuit board joint, for communication of powers and signals. In step 260, the avionics assembly is mounted to a satellite or spacecraft's primary structure.

Method and apparatuses have been disclosed herein to provide ruggedized avionics assemblies on satellites and spacecrafts configured for a kinetic space launch. While the disclosure describes various embodiments of satellites and spacecrafts, the ruggedized avionics assembly may also be applied to other types of payloads that are launched kinetically. With this disclosure, the ruggedized avionics assembly can withstand static or quasi-static acceleration forces of over 5,000 times Earth's gravity.

While specific embodiments of, and examples for, the system are described above for illustrative purposes, various equivalent modifications are possible within the scope of the system, as those skilled in the relevant art will recognize. For example, while processes or steps are presented in a given order, alternative embodiments may perform routines having steps in a different order, and some processes or steps may be deleted, moved, added, subdivided, combined, and/or modified to provide alternative or sub-combinations. Each of these processes or steps may be implemented in a variety of different ways. Also, while processes or steps are at times shown as being performed in series, these processes or steps may instead be performed in parallel, or may be performed at different times.

While various embodiments have been described above, it should be understood that they have been presented by way of example only, and not limitation. The descriptions are not intended to limit the scope of the invention to the particular forms set forth herein. To the contrary, the present descriptions are intended to cover such alternatives, modifications, and equivalents as may be included within the spirit and scope of the invention as defined by the appended claims and otherwise appreciated by one of ordinary skill in the art. Thus, the breadth and scope of a preferred embodiment should not be limited by any of the above-described exemplary embodiments.

What is claimed is:

1. A ruggedized, mass-efficient avionics assembly for use on a centripetally launched vehicle, the avionics assembly being configured to withstand a static or quasi-static acceleration load during a centripetal launch of at least 5,000 times Earth's gravity, the avionics assembly comprising:
a plurality of printed circuit boards, each printed circuit board mounted with an at least one electronic component, the plurality of printed circuit boards being attached directly to a primary structure of the vehicle along a vertical edge of each printed circuit board using a bonded bracket, the plurality of printed circuit boards further being configured to be aligned in parallel with a static or quasi-static acceleration vector directed at a center of a centripetal launcher, wherein the acceleration vector is generated by the centripetal launcher;
a plurality of stiffening frames attached to at least one side of at least one of the plurality of printed circuit boards;
a bracing member is mounted to at least two points of each of the stiffening frames on each of the printed circuit boards; and
an at least one board-to-board connection configured to facilitate communication between the plurality of printed circuit boards through at least one of a board-to-board connector or a flexible printed circuit board joint.

2. The avionics assembly of claim 1, further comprising the avionics assembly being mounted perpendicularly to a vertical support surface.

3. The avionics assembly of claim 2, wherein the bracing member is attached to and extending horizontally from the vertical support surface, the plurality of printed circuit boards having at least one horizontal edge substantially perpendicular to the vertical support surface, wherein a portion of the stiffening frames extends parallel and even with the at least one horizontal edge, and the bracing member is attached to the portion of the stiffening frames.

4. The avionics assembly of claim 3, further comprising the bonded brackets being used to attach the bracing member to the vertical support surface.

5. The avionics assembly of claim 1, further comprising the bonded brackets being used to attach the plurality of printed circuit boards to the primary structure of the vehicle.

6. The avionics assembly of claim 1, further comprising the stiffening frames being comprised of at least one of a high specific strength or high stiffness material.

7. The avionics assembly of claim 6, further comprising the high specific strength or high stiffness material including at least one of: aluminum, magnesium, beryllium, silicon carbide or carbon fiber composite.

8. The avionics assembly of claim 1, further comprising a substrate of one of the plurality of printed circuit boards comprising at least one material with higher specific stiffness than traditional FR-4 composite.

9. The avionics assembly of claim 1, further comprising the stiffening frames being designed using topology optimization methods.

10. The avionics assembly of claim 1, further comprising the stiffening frames being 3D printed.

11. The avionics assembly of claim 1, further comprising the at least one electronic component being structurally reinforced.

12. The avionics assembly of claim 11, further comprising the at least one electronic component being structurally reinforced using underfill or staking techniques.

13. The avionics assembly of claim 1 further comprising the acceleration load being transferred as a compressive force to the centripetally launched vehicle.

14. The avionics assembly of claim 1, further comprising an enclosure covering the avionics assembly, the enclosure being able to protect the avionics assembly from radiation or to control thermal conditions.

15. A method for providing ruggedized avionics assemblies for use on a centripetally launched vehicle to withstand static and quasi-static acceleration forces, the method comprising:
  mounting at least one electronic component to at least one of a plurality of printed circuit boards;
  connecting the plurality of printed circuit boards through an at least one board-to-board connector and an at least one flexible printed circuit board joint for communication and power signals;
  attaching a plurality of stiffening frames to at least one side of at least one of the plurality of printed circuit boards;
  mounting a bracing member to at least two points of each of the stiffening frames on each of the printed circuit boards; and
  mounting the plurality of printed circuit boards to the centripetally launched vehicle's primary structure along a vertical edge of the plurality of printed circuit boards using a bonded bracket.

16. The method of claim 15, further comprising mounting the plurality of printed circuit boards perpendicularly to a vertical support surface.

17. The method of claim 16, wherein the bracing member is attached horizontally to the vertical support surface, the plurality of printed circuit boards having at least one horizontal edge substantially perpendicular to the vertical support surface, wherein a portion of the stiffening frames extends parallel and even with the at least one horizontal edge, and the bracing member attaching to the portion of the stiffening frames.

18. The method of claim 17, further comprising using the bonded brackets to attach the bracing member to the vertical support surface.

19. The method of claim 15, further comprising using the bonded brackets to attach the plurality of printed circuit boards to the primary structure of the vehicle.

20. The method of claim 15, further comprising constructing the stiffening frames out of at least one of a high specific strength or high stiffness material.

21. The method of claim 20, further comprising the at least one high specific strength or high stiffness material including at least one of: aluminum, magnesium, beryllium, silicon carbide or carbon fiber composite.

22. The method of claim 15, further comprising constructing the plurality of printed circuit boards from at least one material with higher specific stiffness than traditional FR-4 composite.

23. The method of claim 15, further comprising designing the stiffening frames using topology optimization methods.

24. The method of claim 15, further comprising 3D printing the stiffening frames.

25. The method of claim 15, further comprising structurally reinforcing the at least one electronic component using underfill or staking.

26. The method of claim 15, further comprising the static and quasi-static acceleration forces generated during a centripetal launch being transferred as a compressive force to the centripetally launched vehicle.

27. The method of claim 15, further comprising providing an enclosure covering one of the avionics assemblies to provide protection from radiation or to control thermal conditions.

28. A printed circuit board housing assembly configured to withstand a static or quasi-static acceleration load during a centripetal launch, the printed circuit board housing assembly comprising:
  a plurality of printed circuit boards, each printed circuit board mounted with an at least one electronic component, the plurality of printed circuit boards each being attached directly to a primary structure of a vehicle along an edge of the plurality of circuit boards using a bonded bracket;
  a plurality of stiffening frames attached to at least one side of at least one of the plurality of printed circuit boards;
  an at least one board-to-board connection configured to facilitate communication between the plurality of printed circuit boards through at least one of a board-to-board connector or a flexible printed circuit board joint; and
  at least one bracing member attached to and extending approximately normally to a support surface, the at least one bracing member attaching to at least one edge of at least one of the plurality of printed circuit boards; and
  the at least one bracing member is mounted to at least two points of the stiffening frames on each of the printed circuit boards.

29. The avionics assembly of claim 1, wherein the at least one bracing member is mounted using steel screws and wherein the at least one bracing member includes one or more diamond shaped apertures thereby reducing weight.

* * * * *